United States Patent
Mitrovic et al.

(10) Patent No.: US 6,824,363 B2
(45) Date of Patent: Nov. 30, 2004

(54) LINEAR INDUCTIVE PLASMA PUMP FOR PROCESS REACTORS

(75) Inventors: Andrej S. Mitrovic, Phoenix, AZ (US); Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 70 days.

(21) Appl. No.: 10/325,828

(22) Filed: Dec. 23, 2002

(65) Prior Publication Data

US 2003/0123992 A1 Jul. 3, 2003

Related U.S. Application Data

(60) Provisional application No. 60/343,179, filed on Dec. 31, 2001.

(51) Int. Cl.$^7$ .......................... F04B 57/02; H02K 44/00
(52) U.S. Cl. .......................................... 417/48; 417/50
(58) Field of Search ................ 417/48, 50; 118/723 R; 315/111.21, 111.41

(56) References Cited

U.S. PATENT DOCUMENTS

| | | | | |
|---|---|---|---|---|
| 3,418,206 A | * | 12/1968 | Hall et al. | ................... 376/132 |
| 3,418,500 A | * | 12/1968 | Davis | .......................... 310/308 |
| 4,167,370 A | * | 9/1979 | Graneau et al. | .............. 417/48 |
| 4,390,494 A | * | 6/1983 | Salisbury | .................... 376/107 |
| 5,458,754 A | * | 10/1995 | Sathrum et al. | ....... 204/192.38 |
| 5,531,834 A | * | 7/1996 | Ishizuka et al. | .......... 118/723 I |
| 6,203,710 B1 | * | 3/2001 | Woodbridge | ................ 210/695 |
| 6,217,776 B1 | * | 4/2001 | Ohkawa | ..................... 210/695 |

OTHER PUBLICATIONS

Huba, "NRL PLasma Formulary," 1998 rev. ed., Office of Naval Research, 65 pp.
"Series 3C85 Ferrite Materials," Dexter Magnetics, Cerritos, CA, 2 pp.
Lieberman et al., "Diffusion and Transport," Chapter 4, Principles of Plasma Discharges and Materials Processing, John Wiley & Sons, 1994, pp. 129–153.
Chen, "Diffusion and Resistivity," Chapter 5, Introduction to Plasma Physics and Controlled Fusion, Plenum, 1984, pp. 155–197.
Cann et al., "The Hall Current Plasma Accelerator," Report, ElectroOptical Systems, Pasadena, CA, 1963, 70 pp.

* cited by examiner

*Primary Examiner*—Cheryl J. Tyler
*Assistant Examiner*—Timothy P. Solak
(74) *Attorney, Agent, or Firm*—Pillsbury Winthrop LLP

(57) ABSTRACT

A plasma pump, a plasma processing system and method to pump particles from a first region containing a plasma to a second region at a higher pressure is provided. The plasma pump and the plasma processing system each include a magnetic field producing member disposed within a passageway defined by an inner wall and an outer wall. The magnetic field producing member produces an alternating magnetic field that extends generally transverse to the passageway. An electric field producing member is disposed outside of the passageway and produces an electric field in a direction generally transverse to the passageway and generally transverse to the magnetic field. In one preferred embodiment, the passageway extends vertically and in another preferred embodiment, the passageway extends horizontally.

18 Claims, 20 Drawing Sheets

LINEAR INDUCTIVE PLASMA PUMP FOR PROCESS REACTORS

This application derives the benefit of U.S. Provisional application 60/343,179, filed Dec. 31, 2001, the contents of which are incorporated herein by reference.

BACKGROUND OF THE INVENTION

1. Field of Invention

The present invention relates to process reactors, and in particular relates to reactors employing process gases and a plasma source.

2. Description of Background Information

Typically, plasma is a collection of charged particles containing approximately equal numbers of positive and negative charge carriers and can be used in certain processing systems which are useful for a wide variety of applications. For example, plasma processing systems are of considerable use in material processing and in the manufacture and processing of semiconductors, integrated circuits, displays and other electronic devices, both for etching and layer deposition on substrates, such as, for example, semiconductor wafers.

Generally, the basic components of such a system include a plasma chamber enclosing a processing region in which plasma is formed and a pumping region connecting to a vacuum port. Other basic components of such a system generally include a wafer supporting chuck, which is connected to an RF power supply in order to accelerate the plasma ions to strike the wafer surface with a desired energy. An additional electrode or RF antenna can be used to produce the process plasma. The chuck is normally cylindrical and flat, supporting a substrate for processing. For efficient use of chamber space, i.e. maximizing gas flow uniformity and minimizing the reactor footprint, process gases are injected above or around the plasma region, and the used gases are removed through an annular passage between the chuck and the sidewall to the vacuum pumping port provided in the lower portion of the vacuum chamber. With a large mass flow rate of processing gases, a large pumping speed for removing the used gases is important to process performance including factors such as the etch rate, high aspect ratio etch, profile figure, damage and contamination. The gas conductance of the annular region often severely restricts the pumping speed delivered to the processing region.

In addition to the need of larger chamber conductance, the need for higher pumping speed at the process operating pressure range, i.e., 5–100 m Torr, is generally required for high density plasma (HDP) etch systems. Plasma vacuum pump systems have been proposed for the process system to provide the required pumping speed for removal of effluent gases, for example.

SUMMARY OF THE INVENTION

One aspect of the present invention is to provide a method of pumping particles from a first region containing a plasma to a second region through a passageway having an inlet end and an outlet end. The passageway is defined by an inner wall and an outer wall. The method comprises producing an alternating magnetic field and producing an electric field. The alternating magnetic field extends generally transverse to the passageway. The electric field is produced in a direction generally transverse to the passageway and generally transverse to the magnetic field.

Another aspect of the present invention is to provide a plasma pump that is configured to pump particles from a first region containing a plasma to a second region containing a plasma at a higher pressure. The plasma pump comprises a passageway having an inlet end and an outlet end. The passageway is defined by an inner wall and an outer wall. A magnetic field producing member is constructed and arranged to produce an alternating magnetic field, which extends generally transverse to the passageway. An electric field producing member is constructed and arranged to produce an electric field in a direction generally transverse to the passageway and generally transverse to the magnetic field.

A plasma processing system including the plasma pump described above can-also be provided. The plasma processing system comprises a chamber containing a plasma processing region and a chuck constructed and arranged to support a substrate within the chamber in the plasma processing region. A chamber outlet enables particles within the plasma processing region to exit the chamber to the plasma pump.

Yet another aspect of the present invention is to provide a plasma pump that is configured to pump particles from a first region containing a plasma to a second region containing a plasma at a higher pressure. The plasma pump comprises a passageway having a central inlet region and a peripheral outlet region. The passageway is defined by an inner wall and an outer wall. A substantially radial direction of the passageway extends between the inlet region and the outlet region. A magnetic field producing member is constructed and arranged to produce an alternating magnetic field which extends generally transverse to the radial direction of the passageway. An electric field producing member is constructed and arranged to produce an electric field in a direction generally transverse to the radial direction of the passageway and generally transverse to the magnetic field.

A plasma processing system including the plasma pump described above can also be provided. The plasma processing system comprises a chamber containing a plasma processing region and a chuck constructed and arranged to support a substrate within the chamber in the plasma processing region. A chamber outlet enables particles within the plasma processing region to exit the chamber to the plasma pump.

BRIEF DESCRIPTION OF THE DRAWINGS

The accompanying drawings, which are incorporated in and constitute a part of the specification, embodiments of the invention, and together with the general description given above and the detailed description of the embodiments given below, serve to explain the principles of the invention wherein.

DETAILED DESCRIPTION OF SEVERAL EMBODIMENTS OF THE INVENTION

Figure 1:
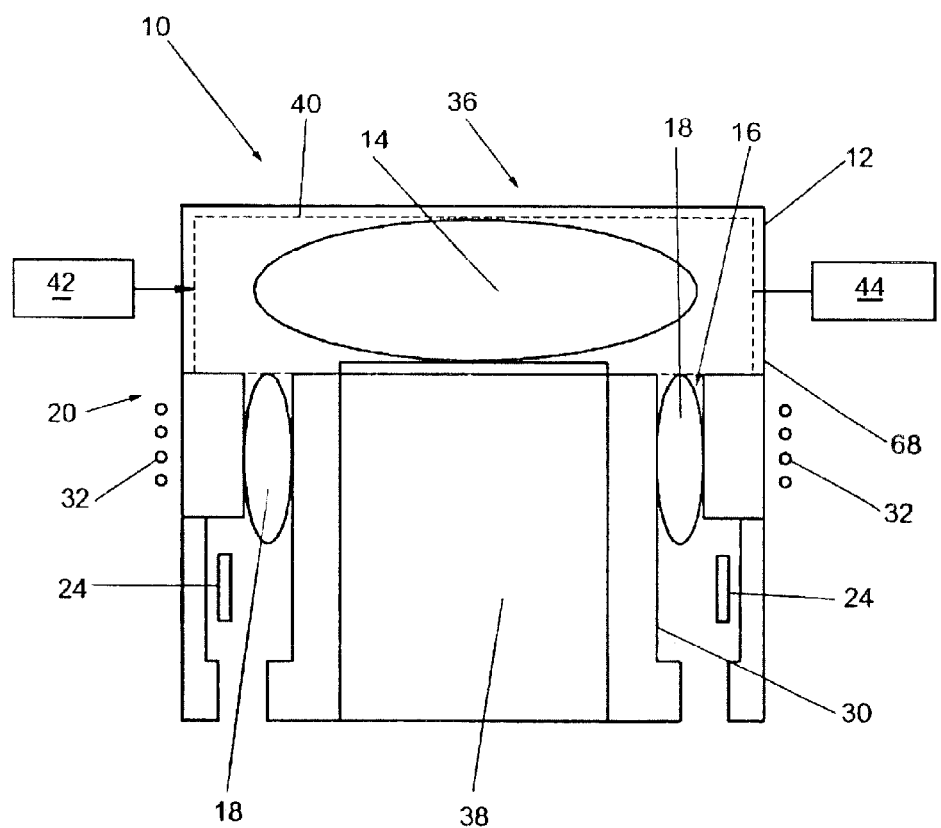
FIG. 1 is a schematic view showing a plasma processing system embodying the principles of the present invention.

FIG. 1 shows the structure of a plasma processing system and a plasma pump according to the present invention. The plasma processing system, generally indicated at 10, includes the plasma pump, generally indicated at 20.

Figure 3:
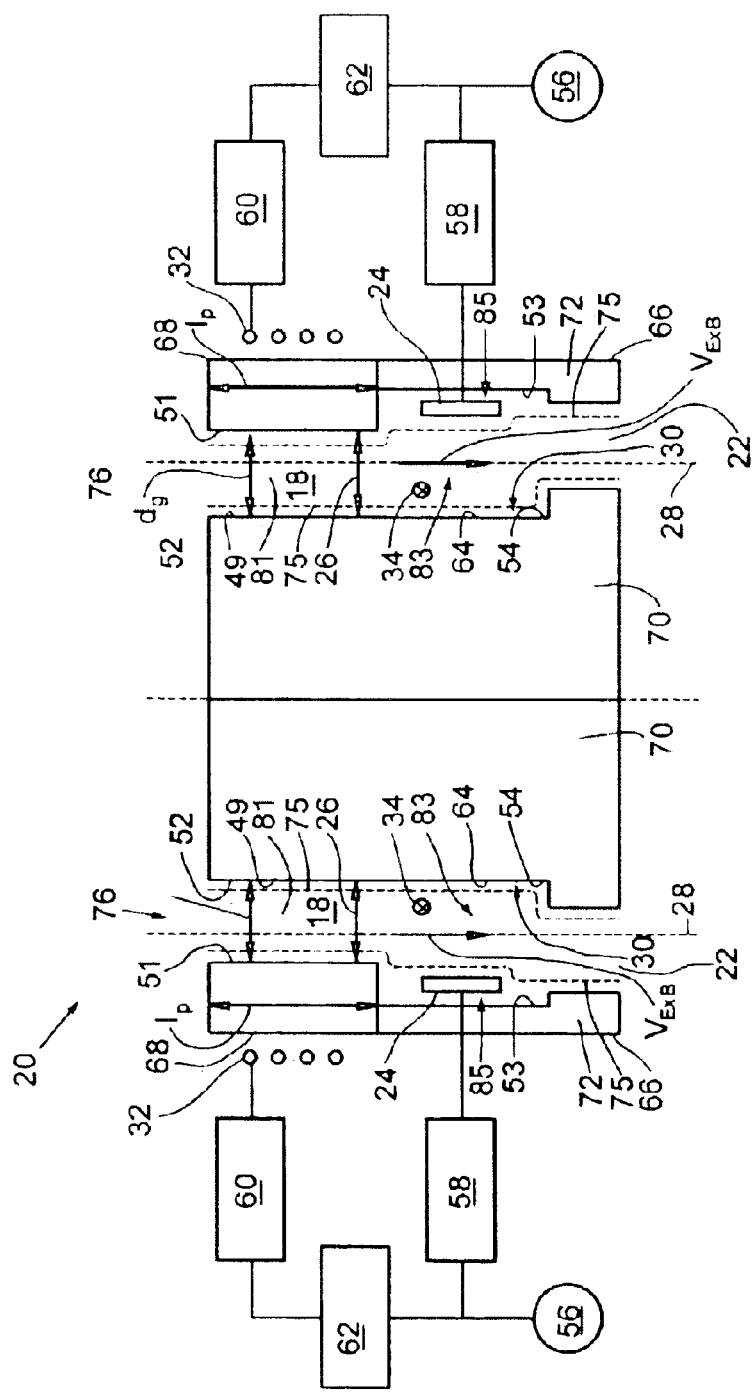
FIG. 3 is a schematic view showing a plasma processing pump embodying the principles of the present invention, the plasma processing pump being configured to be employed in the plasma processing system of FIG. 1.

The plasma pump 20 is configured to pump gases from a first region 12 containing a process plasma 14 through a second region 16 containing a pumping plasma 18, to a third region 22 adjacent the pumping port, which is typically at a pressure that is equal to or greater than process plasma 14. A magnetic field producing member, generally indicated at 24, is in the form of a coil and is arranged in the plasma pump 20. The magnetic field producing member 24 is constructed and arranged to produce an alternating magnetic field 26 (FIG. 3). The alternating magnetic field 26 extends generally transverse to a passageway 30, which is defined by an inner wall 49 and an outer wall 51, 53 (walls 51, 53 cooperate to formm the outer wall of the passageway 30), and the alternating magnetic field 26 has a component in the radial direction. A circumferential electric field producing member 32, in the form of a coil, is disposed outside of the passageway 30 and is constructed and arranged to produce an alternating electric field 34 (FIG. 3), generally transverse to the passageway 30 and generally transverse to the magnetic field 26.

The plasma processing system 10 comprises a vacuum chamber, generally indicated at 36, that defines the first region or the plasma processing region 12, and a chuck 38 constructed and arranged to support a substrate, such as, for example, a semiconductor wafer, within the chamber 36 in the processing region 12. The passageway 30 extends from the process region 12 to the chamber outlet region 22 and can be formed in communication with the chamber 36 to enable gases within the plasma processing region 12 to exit the chamber 36.

Generally, plasma generation gas 40, which can be any gas that is ionizable to produce a plasma, is introduced into the chamber 36 to be made into a plasma. The plasma generation gas 40 can be selected according to the desired application as understood by one skilled in the art and can be nitrogen, xenon, argon, carbon tetrafluoride ($CF_4$) or octafluorocyclobutane ($C_4F_8$) for fluorocarbon chemistries, chlorine ($Cl_2$), hydrogen bromide (HBr), or oxygen ($O_2$), for example.

Gas injector 42 is coupled to the chamber 36 and is configured to introduce plasma processing gases 40 into the plasma processing region 12. A plasma generator 44 is coupled to the chamber 36 to generate plasma 14 within the plasma processing region 12 by ionizing the plasma processing gases 40, for example, by supplying RF or DC power thereto.

A variety of gas injectors 42 and various gas injecting operations can be used to introduce plasma processing gases 40 into the plasma processing region 12. The plasma processing gases, such as generation gas 40, are often introduced from gas injector 42 located adjacent to or opposite from the substrate. For example, as shown in FIG. 2, the gases 40 can be injected through a gas inject plate (not shown) opposite the substrate in an electrostatically shielded radio frequency (ESRF) plasma source.

Figure 2:
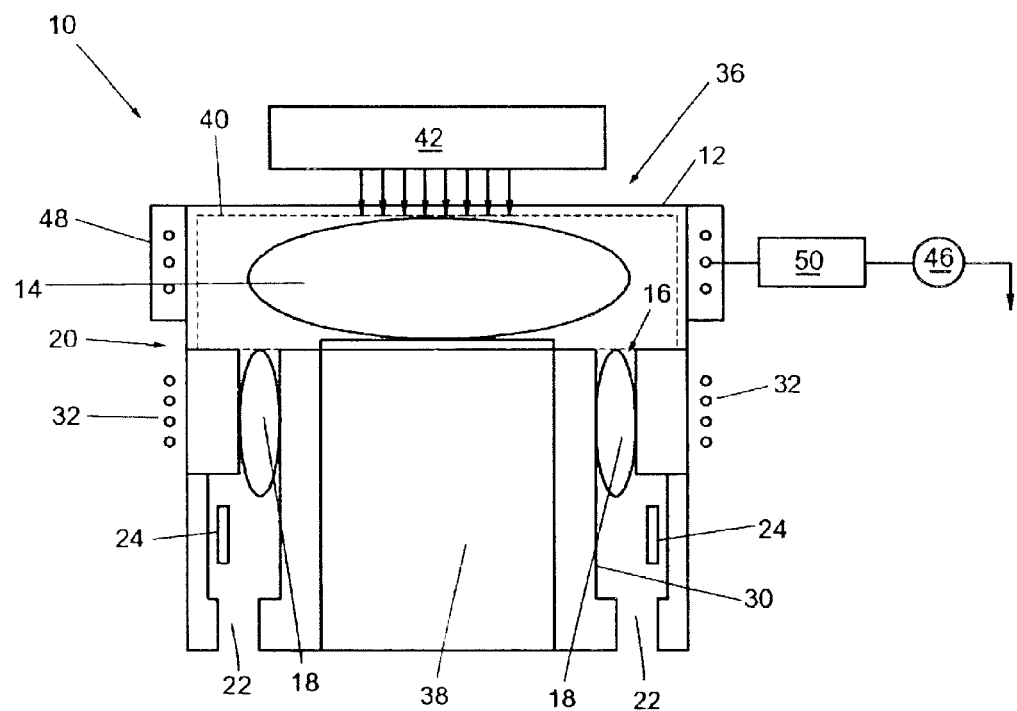
FIG. 2 is a schematic view showing a plasma processing system of FIG. 1, but showing an electrostatically shielded radio frequency (ESRF) plasma source.

As best seen in FIG. 2, a radio frequency (RF) source 46, which can be used in generating the process plasma 14, is coupled to the chamber 36 through connections made to an antenna coil 48. A matching network 50 can be coupled to the RF source 46 and the antenna coil 48, as is generally known in the art. The RF source 46 and the matching network 50 act as the plasma generator 44 shown in FIG. 1.

The chamber 36 is hermetically sealed and the plasma generation gases 40 are introduced into the chamber 36 by the gas injector 42. The effluent gases can be removed through passages formed in the exterior of the chamber 36. The RF power supplied to the plasma can ignite a discharge with the plasma generation gas 40 introduced into the chamber 36, thus generating a plasma, such as plasmas 14, 18. For example, the RF source 46 can inductively couple an RF field from the antenna or RF coil 48 through the dielectric window. In an alternative embodiment not shown, the RF source 46 can capacitively couple an RF field from an electrode in contact with the plasma generation gas 40.

The RF coil 48 can surround the vacuum chamber 36 to create a radio frequency electric field within the vacuum chamber 36 and thus, inductively produce the plasma processing region 12, which contains the process plasma 14 having a potential of 20 volts, for example, in the plasma generation gas 40. The process plasma 14 can have other potentials as well, as is generally known in the art.

Alternatively, in embodiments not shown, the gases can be injected through a dielectric window opposite the substrate in a transformer coupled plasma (TCP) source or through an inject electrode opposite the substrate in a capacitively coupled plasma (CCP) source. Other gas injector arrangements are known to those skilled in the art and can be employed in conjunction with the present invention.

The chamber 36 can be formed from aluminum or another suitable material. Within the chamber 36, the chuck 38 is provided to hold the substrate to be processed by a plasma process. The chuck 38 can hold a semiconductor wafer, integrated circuit, a sheet of a polymer material to be coated, a metal to be surface hardened by ion implantation, or some other semiconductor material to be etched or deposited, for example.

Although not shown, coolant can be supplied to the chuck 38 and/or the magnetic field generator 24 through cooling supply passages coupled to the chamber 38 and/or the conduit 30. Each cooling supply-passage can be coupled to a cooling supply source. For example, the cooling supply passages could be individually connected to the cooling supply source. Alternatively, cooling supply passages could be interconnected by a network of interconnecting passages, which connect all cooling supply passages in some pattern.

Various leads (not shown), for example, voltage probes or other sensors, can be coupled to the plasma processing system 10.

FIG. 3 shows the plasma pump 20, which includes the passageway 30, in greater detail than shown in FIGS. 1 and 2. The passageway 30 can be conceptually referred to as a plasma vacuum pump conduit or a conduit. The passageway 30 has an inlet end 52 disposed adjacent the chamber 36 and an outlet end 54 disposed adjacent the chamber outlet region 22. The passageway 30 defines the second region or the plasma discharge region 16, in which plasma motion can be effected, for example, by an E×B drift, as will be described in further detail below.

Figure 4A:
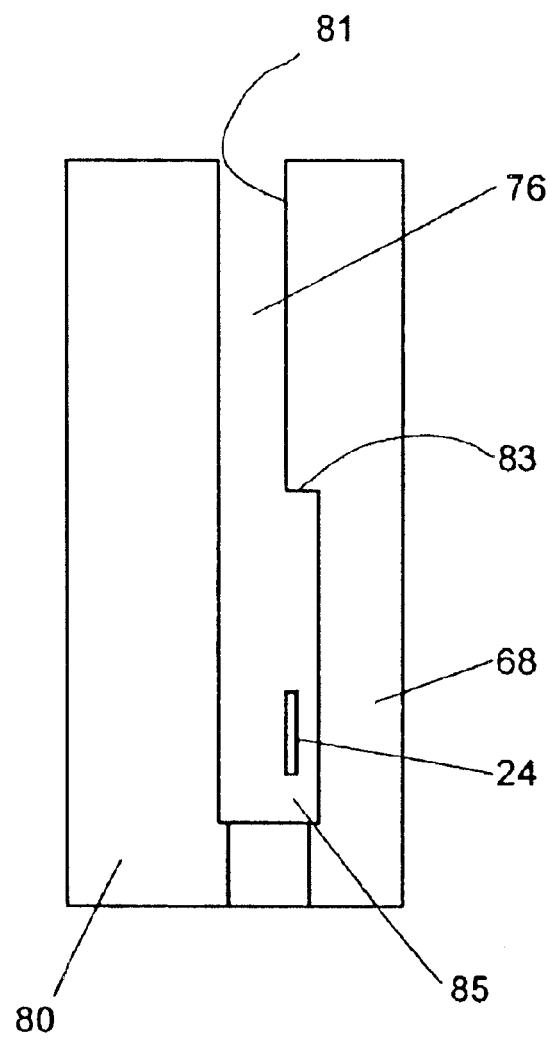
FIG. 4A is an illustrative diagram showing a passageway partially defined by a ferrite material that is disposed in the plasma processing pump shown in FIG. 3.

The passageway 30 can be best understood from FIG. 3, which shows the passageway 30 being at least partially defined by peripheral walls 49, 53 of shieldings 70, 72, respectively, and an interior peripheral wall 51 of a ferrite material 68. An upper (a first) portion 81 of the passageway 30 is defined by the peripheral walls 49, 51 and a lower (a second) portion 83 of the passageway 30 is defined by the peripheral walls 49, 53. As shown in FIGS. 3 and 4A, the passageway 30 includes the upper portion 81, whose cross-section in a plane orthogonal to the passageway 30 is a first annulus, and the lower portion 83, whose cross-section in a plane orthogonal to the passageway 30 is a second annulus. The first annulus can be smaller than the second annulus, for example, so as to form a frusto-conical shape.

The passageway 30 can be an annular or cylindrical channel or can have a toroidal configuration that extends circumterentially around an axis 28 (extending between the inlet and outlet ends 52, 54 as shown in FIG. 3). FIG. 3 shows the passageway 30 extending vertically in a longitudinal direction from the inlet end 52 to the outlet end 54 thereof. The walls 49, 53 can be made from quartz material or another insulating or dielectric material. In the embodiment shown in FIG. 3, the peripheral walls 49, 51, 53 extend parallel to the passageway 30.

The passageway 30 is provided adjacent the chamber 36 to enable high speed pumping in the process region 12 to improve overall process performance of the plasma processing system 10. The passageway 30 can be used with any of the examples of plasma generating systems described above or with other, non-described plasma generators.

A system pump (not shown) can be coupled to the outlet end 54 of the passageway 30 to help remove pumping plasma 18 from the passageway 30. The system pump can be another plasma pump 20, a turbomolecular pump, or another type of plasma pump.

FIG. 3 shows the interior peripheral wall 49 extending generally vertical and having a generally L-shaped configuration. The interior peripheral wall 49 is defined by the first shielding 70 disposed opposite to the second shielding 72, which defines the interior peripheral wall 53. The interior peripheral wall 53 is generally a mirror image of the interior peripheral wall 49 and extends generally parallel to the passageway 30. The interior peripheral wall 53 extends generally in the same direction as the interior peripheral wall 51, opposite to the interior peripheral wall 49.

As illustrated in FIGS. 3 and 4A, the ferrite material 68, together with the shieldings 70, 72, defines an annular gap 76 of length $l_p$ and width $d_g$. The space between the interior peripheral walls 49, 51 defines the width $d_g$ of the gap 76. The ferrite material 68 and shieldings 70, 72 can define a central portion 74 that is configured to at least partially surround the annular gap 76. The shieldings 70, 72 are configured to at least partially surround the annular gap 76 such that energy coupled from the electric field producing member 32 into the gap 76 is reduced. The gap 76 can extend across the upper portion 81 of the passageway, as illustrated in FIGS. 3 and 4A.

Furthermore, as shown in FIG. 3, a quartz shield 75 is used to electrically insulate the ferrite material 68 from the plasma 18. Cooling liquid (not shown) can be circulated between the ferrite material 68 and the quartz shield 75, for example, to control the ferrite temperature. The quartz shield 75 can act as a conduit for gas.

The bottom of the gap 76 is adjacent to the interior peripheral wall 53 of the second shielding 72 and the lower portion of the interior peripheral wall 49. To prevent coupling of the PF energy from the plasma 18 to the central portion 74, the gap width $d_g$ could be larger than the skin depth of the plasma 18, for example, 0–10 millimeters. The length $l_p$ could be selected to be smaller than the ion gyroradius in the magnetic field 26 in the passageway 30, for example, around 35 millimeters, as will be further described below.

As shown in FIG. 3, the magnetic field producing member 24 is employed to provide the alternating magnetic field 26, which extends generally transverse to the passageway 30 and has a radial component. As illustrated, the magnetic field producing member 24 is disposed within the lower portion 83 (FIG. 4A) of the passageway 30, which is at least partially defined by the ferrite material 68. FIGS. 3 and 4A show the magnetic field producing member 24 disposed in an outer section 85 of the lower portion 83 and adjacent to the bottom plate 80, as described in further detail below.

The magnetic field producing member 24 is illustrated as an annular strip positioned within the passageway 30, but the magnetic field producing member 24 could have other shapes or could be positioned in other positions within the passageway 30 to produce the alternating magnetic field 26. The strength of the magnetic field 26 can remain constant across the passageway 30 and can be on the order of several hundred Gauss, for example, 200 Gauss. The magnetic field producing member 24 can be a single turn magnetic field generation coil, for example, having a cross section of 1 inch by 0.125 inch.

A power supply, such as RF source 56, and a RF power amplifier 58 are in electrical communication with and can be used to drive the magnetic field producing member 24. The RF source 56, together with a RF power amplifier 60 can be used to drive the electric field producing member 32 to produce the electric field 34. The RF source 56, which can be an AC exciter, for example, is configured to drive the magnetic field producing member 24 and the electric field producing member 32 at the same AC frequency. Because the magnetic field producing member 24 and the electric field producing member 32 are driven by a common RF source, i.e., RF source 56, a strict phase relationship between the magnetic field 24 and the circumferential electric field 34 can be maintained. A phase shifter 62 can be coupled between RF power amplifier 60 and the RF source 56. The phase shifter 62 is configured to adjust the phase relationship between the magnetic field 24 and the electric field 34, for example, by controlling a phase difference between the power supplied to the magnetic field producing member 24 and the power supplied to the electric field producing member 32.

The circumferential electric field 34 cooperates with the magnetic field 24 to generate a drift velocity, which is defined by the equation $V_{E \times B}$ (E×B)/B$^2$, of electrons in a direction perpendicular to both the magnetic field 26 and the electric field 34. (E×B)/B$^2$ is the velocity of the electrons which drift with a spiral motion in the direction defined by the vector E×B (perpendicular to the electric field 34), which is illustrated in FIG. 3 in the axial direction outward from the outlet end 54 of the conduit 30. The direction of the drift, as defined by the vector E×B, can be kept constant by ensuring that the magnetic field 24 and the electric field 34 alternate in phase with each other, which can be controlled with the phase shifter 62. As a result, the drift velocity, $V_{E \times B}$, always points in one direction, out of the plasma conduit 30 and behaves in time as a rectified sine wave. Electrons and positive ions tend to drift in the direction of E×B.

The magnetic field 26 induces a circumferential electric field (not shown) in the skin depth of the pumping plasma 18. An axial induced magnetic flux density from the ESRF field (which can be produced by the circumferential electric field 34 used to maintain plasma density of the plasma 18, for example) can cause a predominantly radial flux density vector, which is excited by the magnetic field producing member 24, to change direction by an angle, such as, for example, ±10°, during each RF half-cycle. As a result, the drift velocity of the electrons ((E×B)/B$^2$) does not always point along the passageway 30, but also changes direction within the passageway 30 by this angle. Although the direction of the electron drift (E×B) can be changed by this angle during each RF half-cycle, the angle is small enough so as not to deter the drift velocity of the electrons ((E×B)/B$^2$) from being directed in the direction of the axis 28, within the passageway 30, outward from the outlet end 54 thereof. Electrons and positive ions tend to drift in the direction of E×B.

Figure 4B:
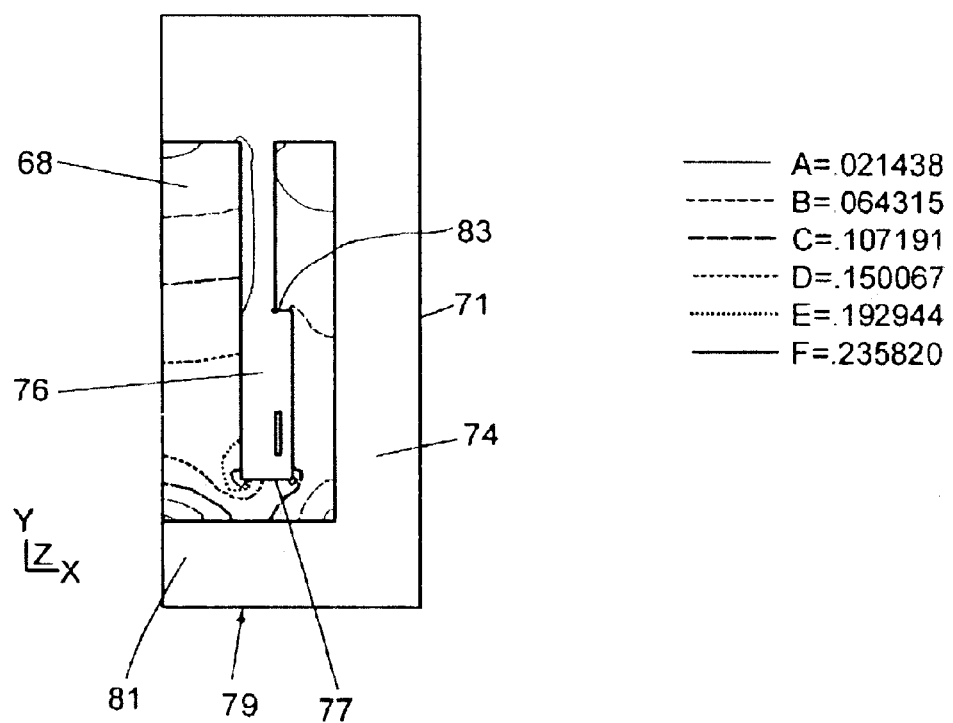
FIG. 4B is an illustrative diagram showing a flux density contour plot in a magnetic circuit of the ferrite material shown in FIG. 4A.
Figure 4C:
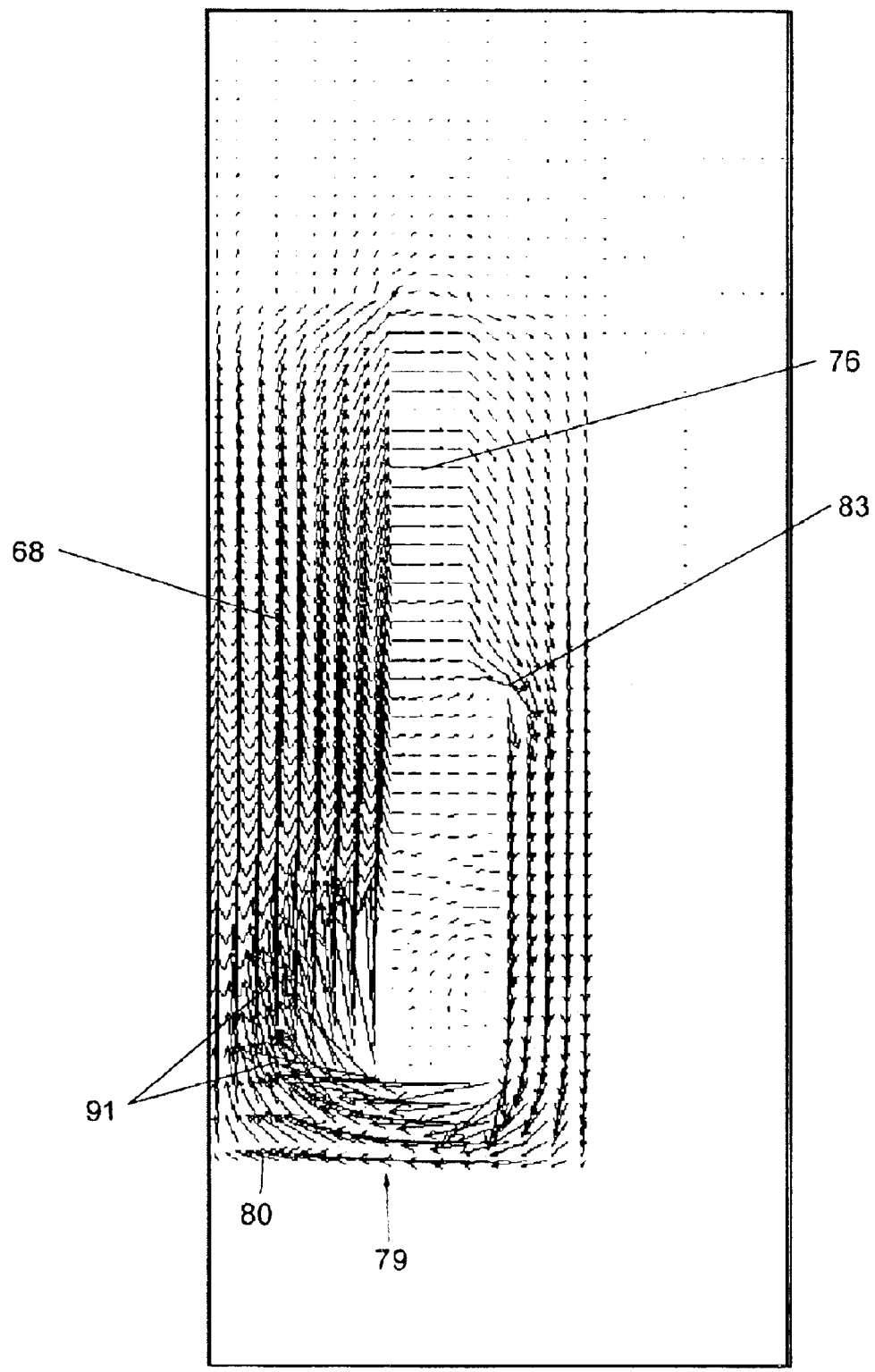
FIG. 4C is an illustrative diagram showing a flux density vector plot in the magnetic circuit of the ferrite material shown in FIG. 4A.

FIGS. 4A–4C show the ferrite material 68 in greater detail, with FIG. 4A showing ferrite material 68 being configured to be disposed in the plasma processing pump 20. The ferrite material 68 is formed into a C-shaped or cup-like wall 71 that opens toward the interior peripheral wall 49 to define the interior peripheral wall 51. As illustrated, the ferrite material 68 and the central portion 74 extend generally vertically along the passageway 30. The bottom plate 80, which can be circular, annular or any other configuration that complements the passageway configuration, is positioned to close the magnetic circuit in the ferrite material 68. The bottom plate 80 is configured to allow gas passing through the passageway 30 to exit the passageway, by way of slots 87 (FIG. 4D) formed in the bottom plate 80. The side slots, machined in the pole piece 51, are to allow the electric field from element (coil) 32 to be coupled to the plasma.

Figure 4D:
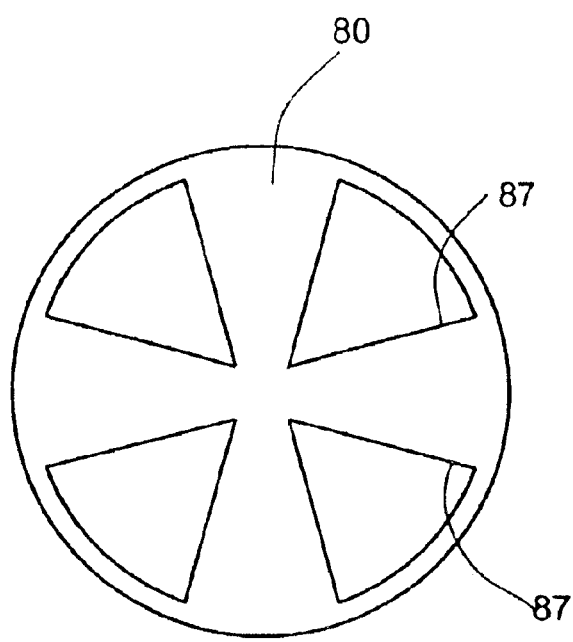
FIG. 4D is a bottom view of a bottom plate of the ferrite material shown in FIG. 4A.

Although four wedge-shaped slots 87 are shown in FIG. 4D, any number of slots 87 having one or more sizes and configurations can be formed in the bottom plate 80. The slots 87 need not necessarily be wedge-shaped and can have any configuration or size. For example, the slots could be annular shaped or oval shaped holes arranged in a circular array.

FIGS. 4B and 4C show a flux density in the magnetic circuit of the ferrite material 68. FIG. 4B is scaled to a range of about 0 to 0.386 T while FIG. 4C is scaled to range from about 0 to 0.277 T. Specifically, FIG. 4B shows a contour plot of the flux density in which the flux density is nonuniform (as represented at reference numeral 79) at a junction 77 formed between the central portion 74 and the bottom plate 80. FIG. 4C shows a vector plot of the flux density in the magnetic circuit of the ferrite material 68. The magnetic field, which can be represented by the magnetic field 26 produced by the magnetic field producing member 24, is illustrated in FIGS. 4B and 4C and extends upwardly and outwardly from the lowermost portion of the central portion 74. Numeral 91 (as indicated as single arrows in FIG. 4C) indicates material that is highly magnetically stressed.

The ferrite material 68 can be selected to be a high-power rated ferrite. The ferrite power loss per unit volume (LPUV) can be expressed in W/cm$^3$ and is a function of flux density B, as measured in Tesla (T), and AC excitation frequency $f$ as measured in Hertz (Hz). Although the LPUV data is generally provided by the manufacturer of the ferrite material, the LPUV can be expressed as an equation, LPUV=2.7561·10$^{-7}$·B$^{1.91}$·$f^{1.52}$, where B is the peak (amplitude) value, not rms and the value of $f^{1.52}$ is dependent upon the material being used. An excitation frequency of the magnetic field 26 can be selected, for example, to be 1 MHz, so that the ferrite material maintains a suitable power loss per unit volume, for example, around 1 W/cm$^3$ at locations of maximum magnetic field in the core. One suitable ferrite is manufactured by Dexter Magnetics, Inc. and manufactured under the part number 3C85.

Figure 5:
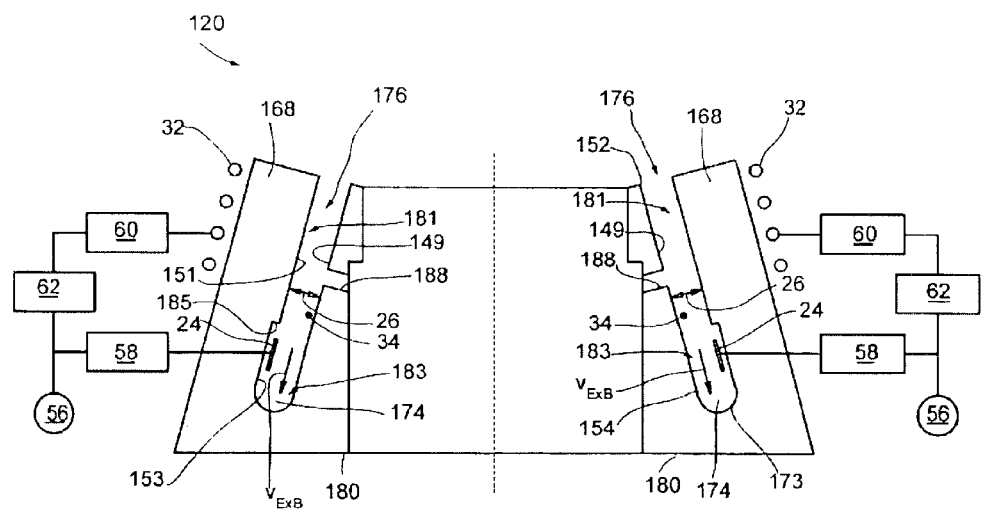
FIG. 5 is a schematic view showing an alternative plasma processing pump embodying the principles of the present invention, the alternative plasma processing pump being configured to be employed in the plasma processing system of FIG. 1
Figure 6:
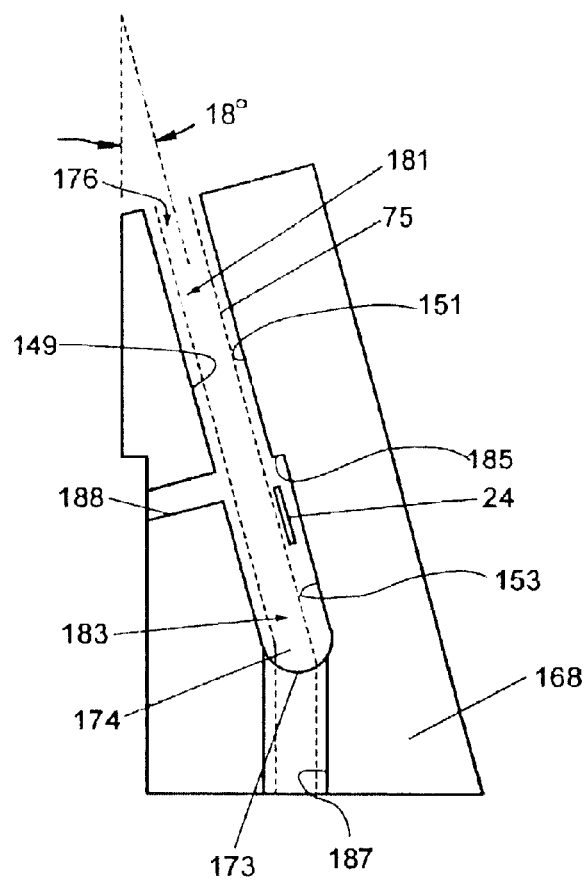
FIGS. 6 and 6A are illustrative diagrams showing an alternative embodiment of a ferrite material that partially defines a passageway and that can be disposed in the plasma processing pump shown in FIG. 5.
Figure 6A:
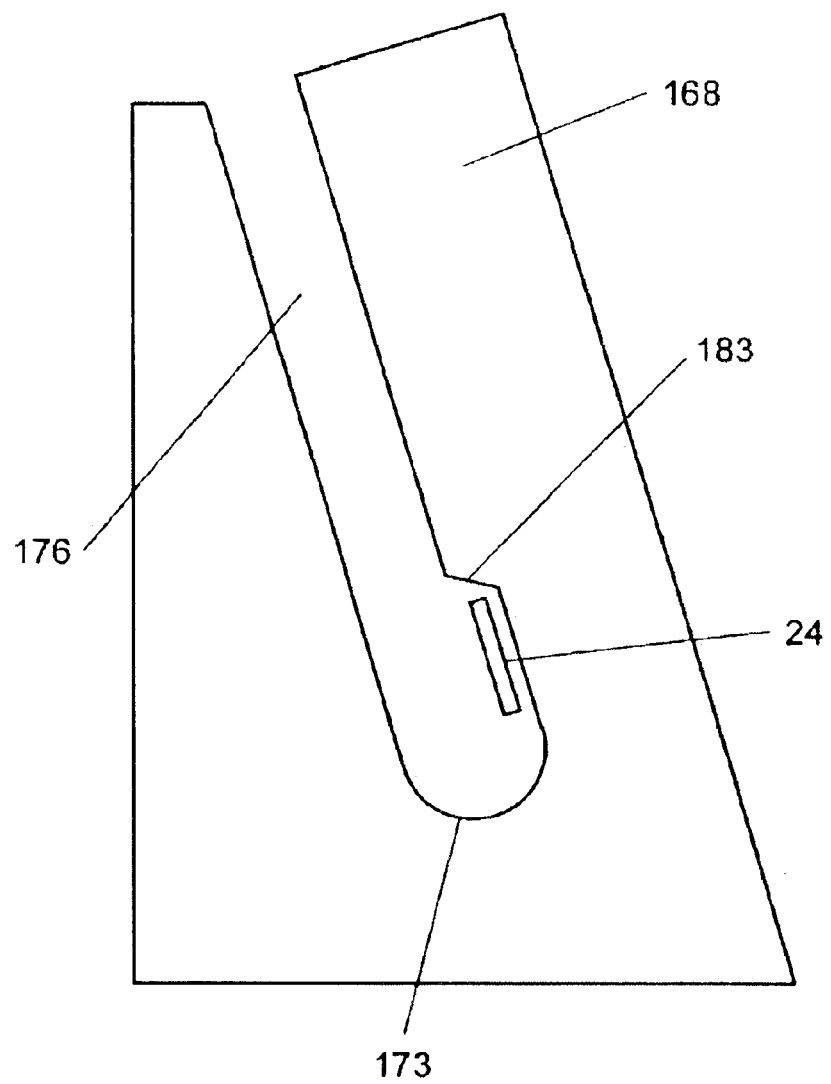

Alternatively, a ferrite material 168 could be provided in the plasma processing pump 20 instead of the ferrite material 68, as shown in FIG. 5. FIGS. 6 and 6A–6C show the ferrite material 168 in greater detail, with FIGS. 6 and 6A showing the ferrite material 168 being configured to be disposed in the plasma processing pump 20. The ferrite material 168 is substantially identical in basic structure and basic operation as that of the ferrite material 68, however, the ferrite material 168 differs from the ferrite material 68 in at least that the ferrite material 168 is angled away from a centerline thereof (as indicated at 169), for example, by an angle of 18°. As best seen in FIGS. 5 and 6, the angled ferrite material 168 partially defines a passageway 130 having a generally frusto-conical configuration. For example, the passageway 130 includes an upper (a first) portion 181, whose cross-section in a plane orthogonal to the passageway 130 is a first annulus, and a lower (a second) portion 183, whose cross-section in a plane orthogonal to the passageway 130 is a second annulus. The first annulus can be smaller than the second annulus, for example, so as to form the frusto-conical configuration of the passageway 130.

Additionally, the ferrite material 168 has a semicircular fillet 173 at the bottom portion thereof, which helps to reduce the flux density concentration at the corners of the ferrite material 168.

The lower portion 183 of the passageway 130 is configured to receive the magnetic field producing member 24 and has a shorter length (is shorter axially) than the lower portion 83 of the passageway 30. The lower portion 183 is configured to reduce power loss because a central portion 174, which is highly stressed, is shorter in the longitudinal direction thereof.

In embodiments where an upper portion 181 (FIG. 6) of the passageway 130 is smaller than the lower portion 183 of the passageway 130 (i.e., the lower portion has an increased radius), the magnetic field producing member 24 can be disposed in an outer section 185 of the lower portion 183. The outer section 185 can be disposed outside of the gap 176, for example.

As described above, the passageway 130 can be conical or frustoconical, for example, with a cross section thereof increasing toward a bottom plate 180 of the ferrite material 168. The increased cross section produces a reduction in flux density and allows magnetic field 126, which can be produced by the magnetic field producing member 24, to be uniform along the central portion 174.

As shown in FIG. 6, the passageway 130 is defined by an inner wall 149 and an outer wall 151, 153 (walls 151, 153 cooperate to form the outer wall of the passageway 130). The outer wall 151 includes one or more slots 188 formed therein, for example, by machining. The slots 188 can be in any configuration, such as, round holes, and are designed to carry cooling liquid as the liquid is pumped through the gap 176 inside the inner ferrite cone 168. The cooling liquid is pumped from the bottom of the inner ferrite cone 168 and passes through the slots (or small holes) 188 to the opposite side of the inner wall 149, cooling the ferrite 168 from opposite sides. Part of the cooling liquid is carried to the top of the inner cone and is diverted across the top thereof and downwards along the inner wall 152, joining the liquid coming from the slots 188, when being diverted. The liquid is contained within the quartz shield 75, which can completely encase the ferrite core 168, and insulates the ferrite core 168 from the plasma 18. The cooling liquid flows between the quartz shield 75 and the ferrite 168 along the inside walls of the passageway 130. A dielectric liquid can be used, such as, for example, part numbers FC84 or FC72, both being manufactured by Minnesota Mining & Manufacturing (3M). The dielectric liquid and the quartz shield 75 allow the external electromagnetic coil to couple the alternating electromagnetic field 34 through wedge-shaped slots (not shown) without interfering metal of ferrite, e.g. the electromagnetic field penetrates through the quartz shield 75 only.

Figure 7A:
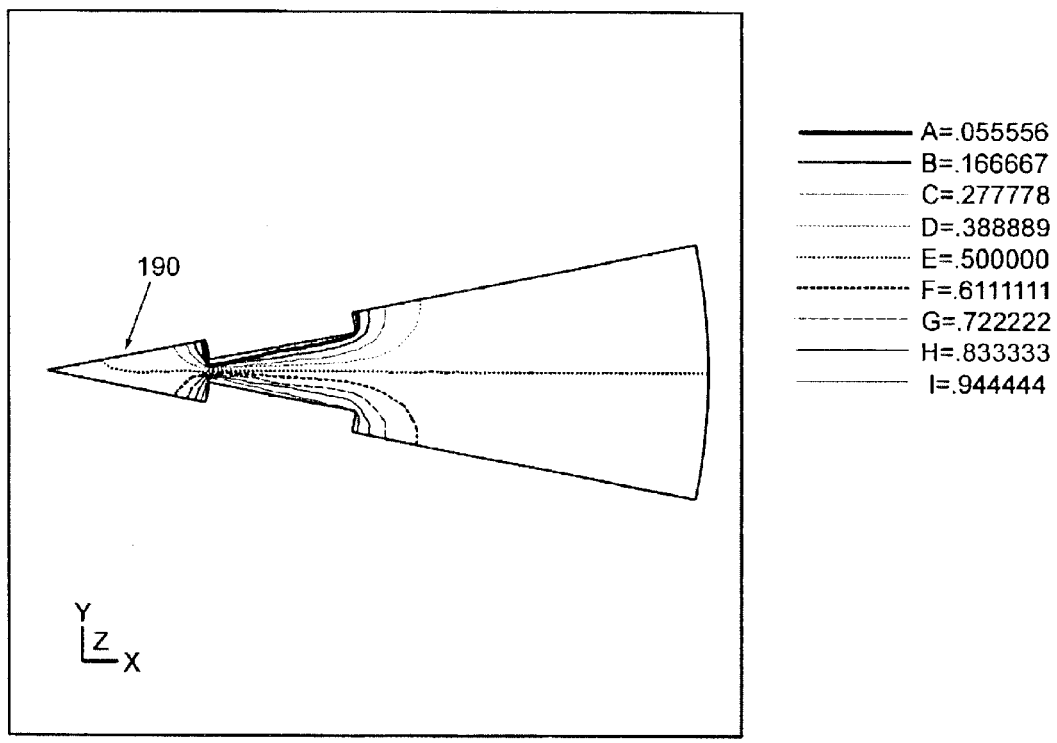
FIGS. 7A and 7B are illustrative diagrams showing potential contour and vector plots in a slot formed in the ferrite material shown in FIGS. 6 and 6A.
Figure 7B:
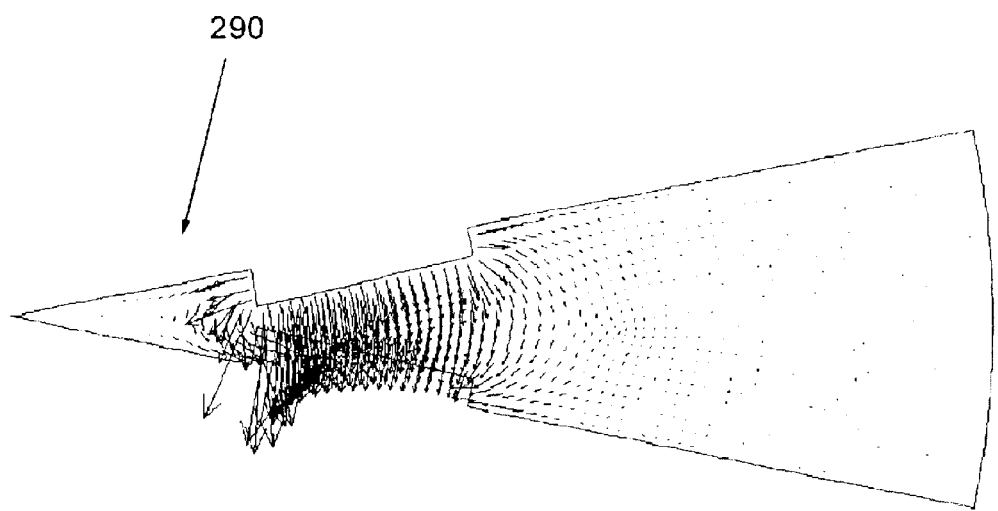

The ferrite material 168 (FIGS. 6 and 6A) can include one or more slots 187, but being substantially similar in construction and operation as slots 87 shown in FIG. 4D) formed therein that are configured to allow gas passing through the passageway 30. One potential contour plot (as represented by reference numerals 190, 290, respectively, in FIGS. 7A and 7B) showing a capacitance in one slot can be used to reduce cross-coupling losses due to undesired RF coupling from the magnetic field producing member 24 and the electric field producing member 32 to the ferrite material 68, 168 and between the coils 24, 32 via the ferrite material 68, 168.

Figure 6B:
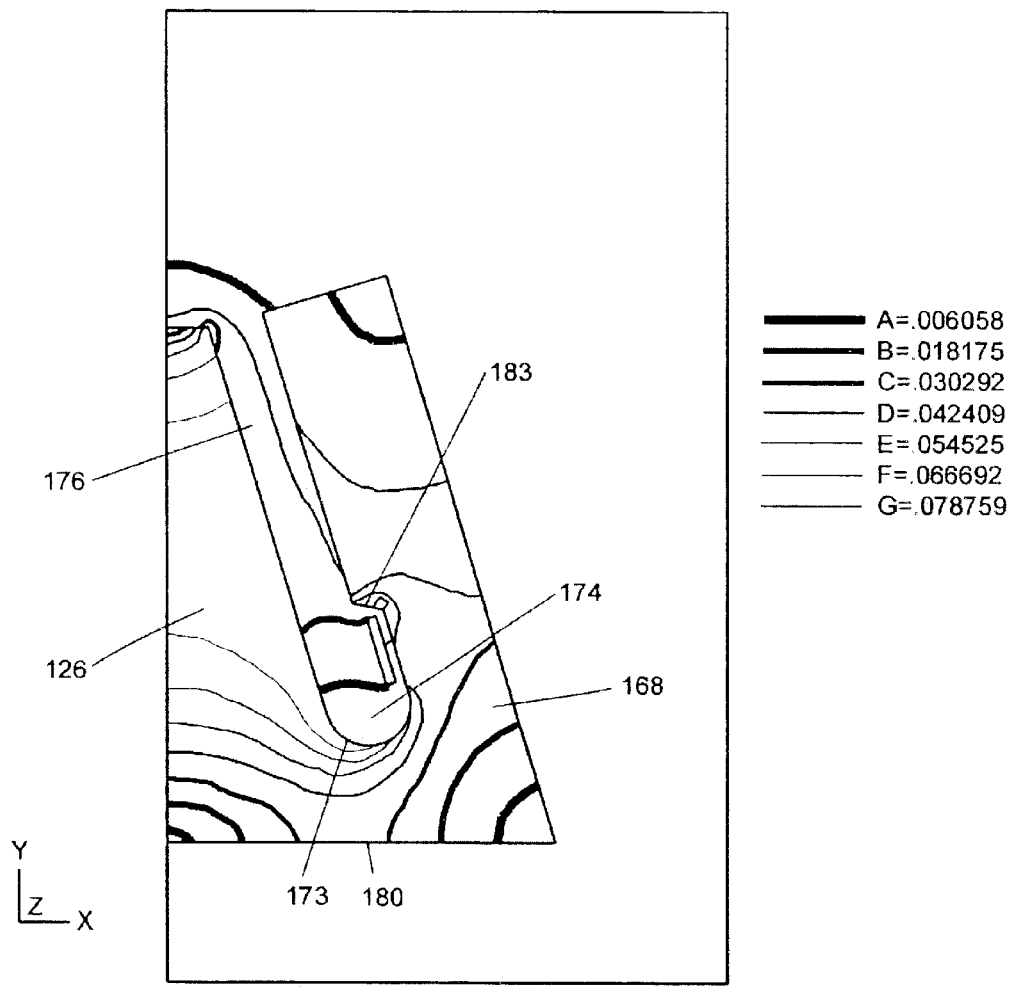
FIG. 6B is an illustrative diagram showing a flux density contour plot in a magnetic circuit of the ferrite material shown in FIGS. 6 and 6A.
Figure 6C:
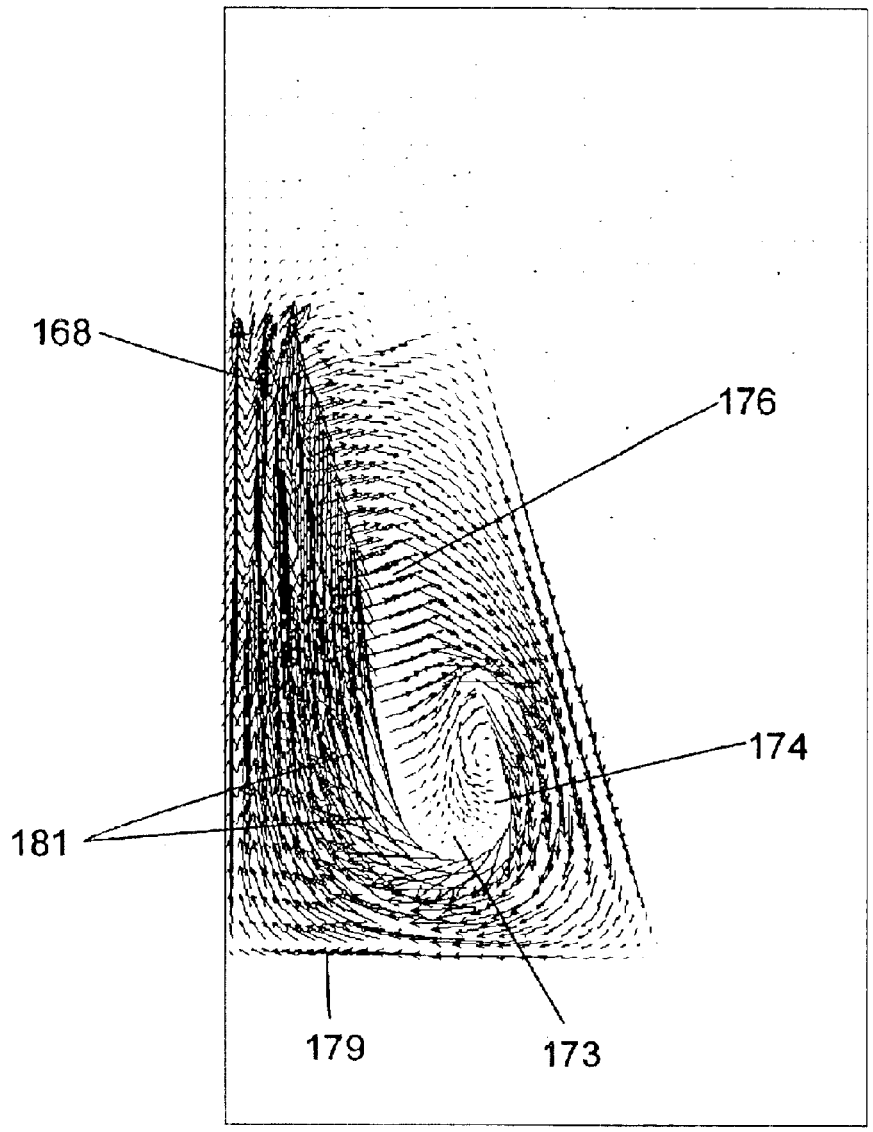
FIG. 6C is an illustrative diagram showing a flux density vector plot in the magnetic circuit of the ferrite material shown in FIGS. 6 and 6A.

FIGS. 6B and 6C show the flux density in the magnetic circuit of the ferrite material 168. FIG. 6B is scaled to a range of about 0 to 0.109 T while FIG. 6C is scaled to range from about 0 to 0.096 T, both of which being reduced from the ranges shown in FIGS. 4B and 4C, respectively.

Specifically, FIG. 6B shows a contour plot of the flux density in which the flux density is generally uniform (as represented at reference numeral 179) along the central portion 174 and at the junction between the central portion 174 and the bottom plate 180. FIG. 6C shows a vector plot of the flux density in the magnetic circuit of the ferrite material 168. Magnetic field 126 is illustrated in FIGS. 6B and 6C and uniformly extends upward along the central portion 174 and outward from the lowermost portion of the central portion 174 (as represented at reference numeral 181).

Ferrite material 168 is selected to be a high-power rated ferrite. The ferrite power loss per unit volume (LPUV) can be expressed in W/cm$^3$ and is a function of flux density B, as measured in Tesla (T), and AC excitation frequency $f$, as measured in Hertz (Hz). Although the LPUV data is generally provided by the manufacturer of the ferrite material, the LPUV can be expressed as an equation, LPUV=$2.7561 \cdot 10^{-7} \cdot B^{1.91} \cdot f^{1.52}$, where B is the peak (amplitude) value, not rms and the value of $f^{1.52}$ is dependent upon the material being used. An excitation frequency of the magnetic field 26 can be selected, for example, to be 1 MHz, so that the ferrite material maintains a suitable total core power loss, for example, 4260 watts (W) or lower. One suitable ferrite is manufactured by Dexter Magnetics, Inc. and manufactured under the part number 3C85.

Alternate configurations of the plasma processing system 10 and the plasma pump system 20 are possible. For example, another embodiment of the present invention will be described below. In the description of the further embodiment, only the points of difference of the embodiment from the first embodiment will the described. That is, in the alternative embodiment shown in FIG. 7, the constituent parts the same as those in the first embodiment are referenced correspondingly in the drawings and the description about them will be omitted.

Figure 8:
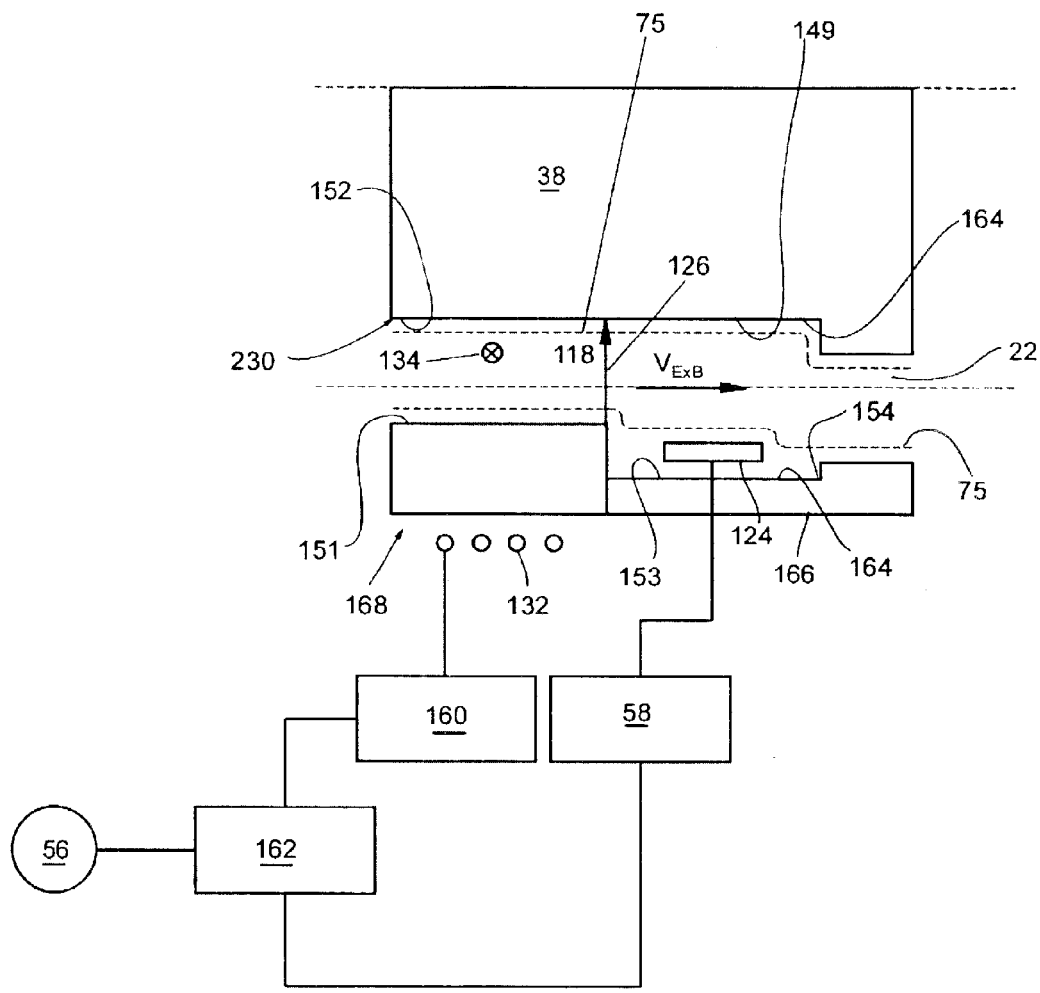
FIGS. 8 and 8A are illustrative diagrams showing another alternative plasma processing pump embodying the principles of the present invention, the other alternative plasma processing pump being configured to be employed in the plasma processing system of FIG. 1.
Figure 8A:
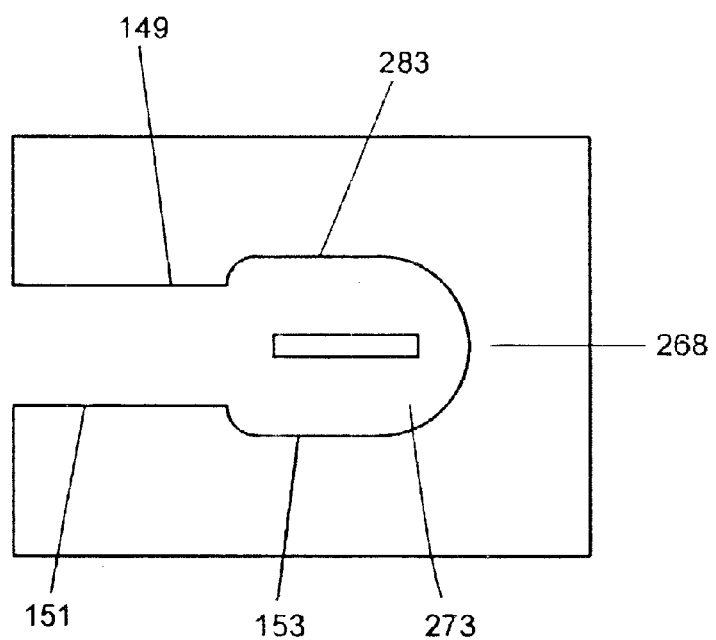

FIGS. 8 and 8A show plasma pump 120, which is one alternative configuration of the plasma pump 20. The plasma pump 120 operates substantially identically to the plasma pump 20 while using plasma flow, which is directed outwardly from the passageway 230, which allows for diverse employment of the plasma processing pumps 20, 120.

The plasma pump 120 includes a passageway 230, which extends horizontally (radially outwardly as shown in FIG. 8), having a central inlet region 152 and a peripheral outlet region 154. An axial direction, as represented by the dashed line 128, extends between the inlet region 152 and the outlet region 154 and the passageway 230 extends horizontally in the axial direction between the inlet region 152 and the outlet region 154. A magnetic field producing member 124 is disposed within the passageway 230 and is constructed and arranged to produce an alternating magnetic field 126. The alternating magnetic field 126 extends generally transverse to the axial direction 128 of the passageway 230 and has a component in a radial direction. An electric field producing member 132 is disposed outside of the passageway 230 and is constructed and arranged to produce a circumferential electric field 134. The electric field 134 is generally transverse to the axial direction 128 of the passageway 230 and also is generally transverse to the magnetic field 126.

As illustrated, the electric field producing member 132 is a flat spiral coil, for example, disposed adjacent to a ferrite core 268, which can constructed and operate identically as either the ferrite material 68 or the ferrite material 168, for example. The ferrite material 268 can be radially slotted, for example, and shielded by shielding 172 to allow penetration of the electric field 134 into the plasma 18 or gas passing through the passageway 30 to exit the passageway 30. As illustrated in FIG. 6, a quartz plate 75 can be positioned between the shielding 172 and the plasma 18. Cooling can be done on only one side of the ferrite 268, for example, when cooling occurs away from the plasma 18 by immersion in a cooling liquid.

Figure 8B:
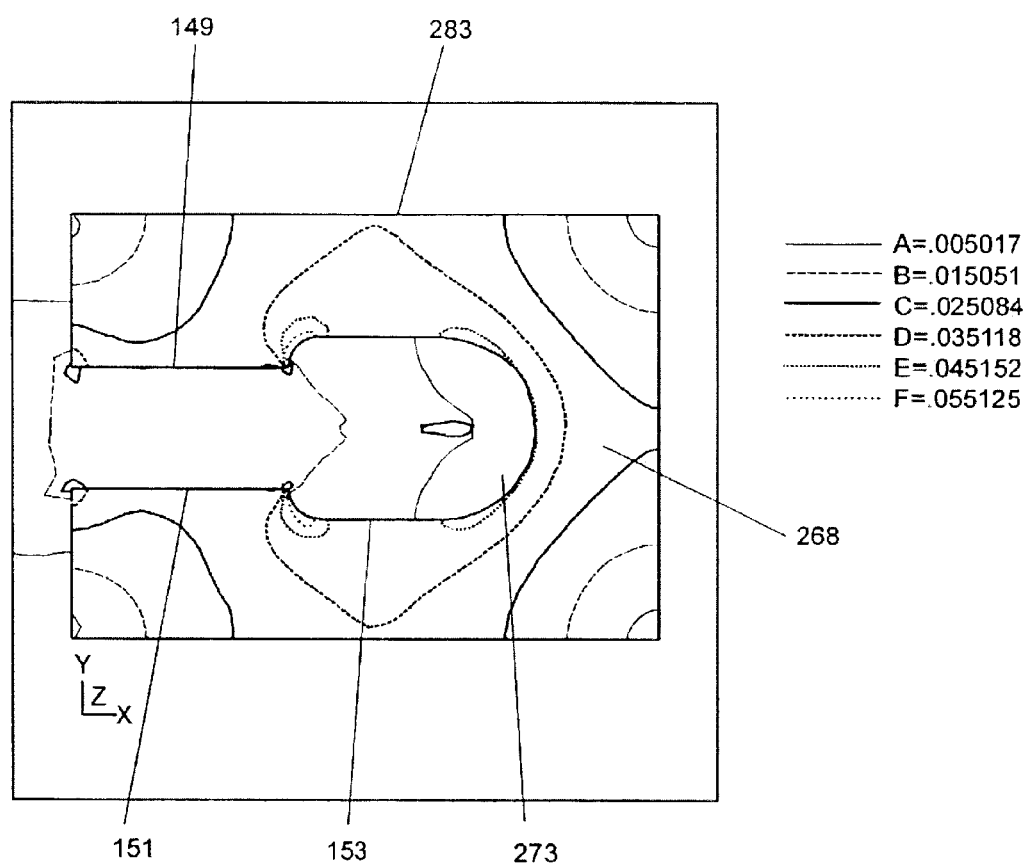
FIG. 8B is an illustrative diagram showing a flux density contour plot in a magnetic circuit of the ferrite material shown in FIGS. 8 and 8A.
Figure 8C:
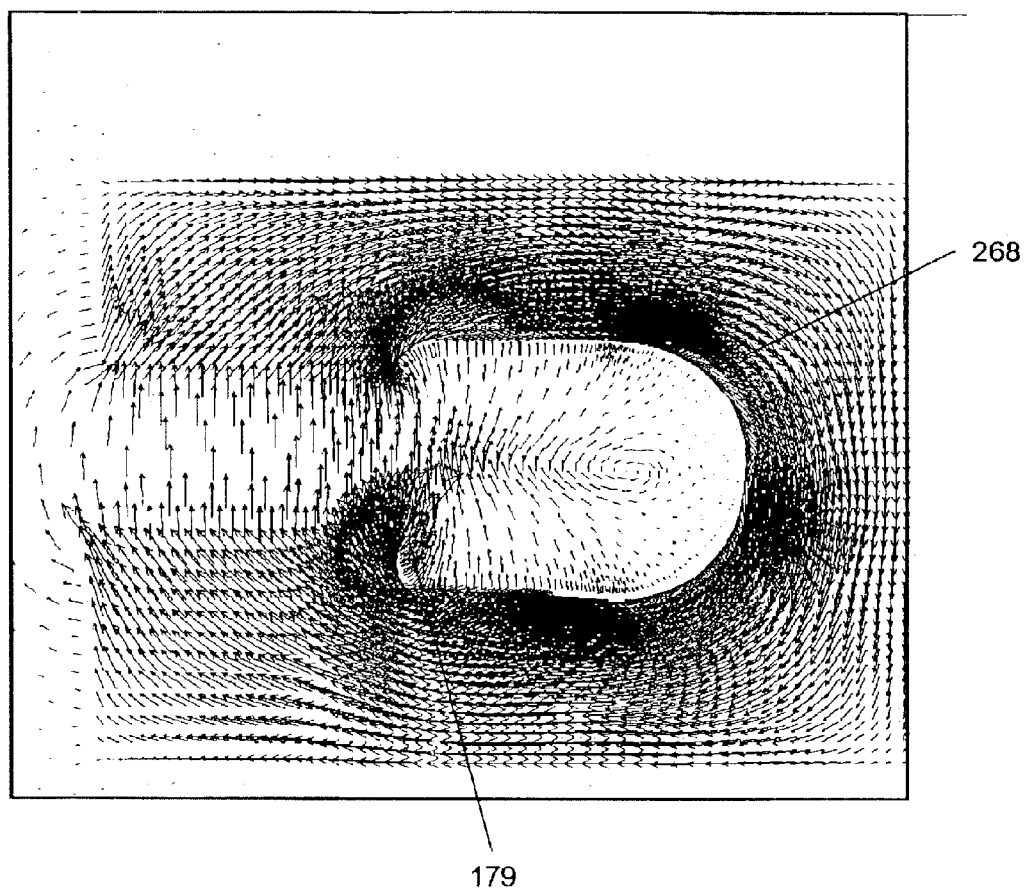
FIG. 8C is an illustrative diagram showing a flux density vector plot in the magnetic circuit of the ferrite material shown in FIGS. 8 and 8A.

FIGS. 8A–8C show the ferrite material 268, but it should be understood that either ferrite material 68 or ferrite material 168 can be used in a plasma pump, such as the plasma pump 10 or the plasma pump 120, for example. As illustrated, the ferrite material 268 has a semicircular fillet 273, partially defined by walls 149, 153, at one end thereof. The semicircular fillet 273 helps to reduce the flux density concentration at the corners of the ferrite material 268. At the other end of the ferrite material 268, a gap 276 is defined by walls 149, 151 of the passageway 230.

An enlarged portion 283 of the passageway 230 is configured to receive a magnetic field producing member, such as the magnetic field producing member 24, and has a shorter length (is shorter axially) than the lower portion 83 of the passageway 30, for example.

FIGS. 8B and 8C show a flux density in the magnetic circuit of the ferrite material 168 shown in FIG. 8. FIGS. 8B and 8C are scaled to a range of about 0 to 0.090T. FIG. 8B shows a contour plot of flux density in which the flux density is uniform (as represented at reference numeral 179). FIG. 8C shows a vector plot of the flux density in the magnetic circuit of the ferrite material 168 shown in FIG. 8. The magnetic field, which can be represented by the magnetic field 26 produced by the magnetic producing member 24, is illustrated in FIGS. 8B and 8C and extends uniformly across the gap 176. Numeral 191 (as indicated as single arrows in FIG. 8C) indicates material that is highly magnetically stressed.

As with the ferrite material 68 shown in FIGS. 4B and 4C, the ferrite material can be selected from a high-power rated ferrite (as expressed as LPUV described above).

Figure 9:
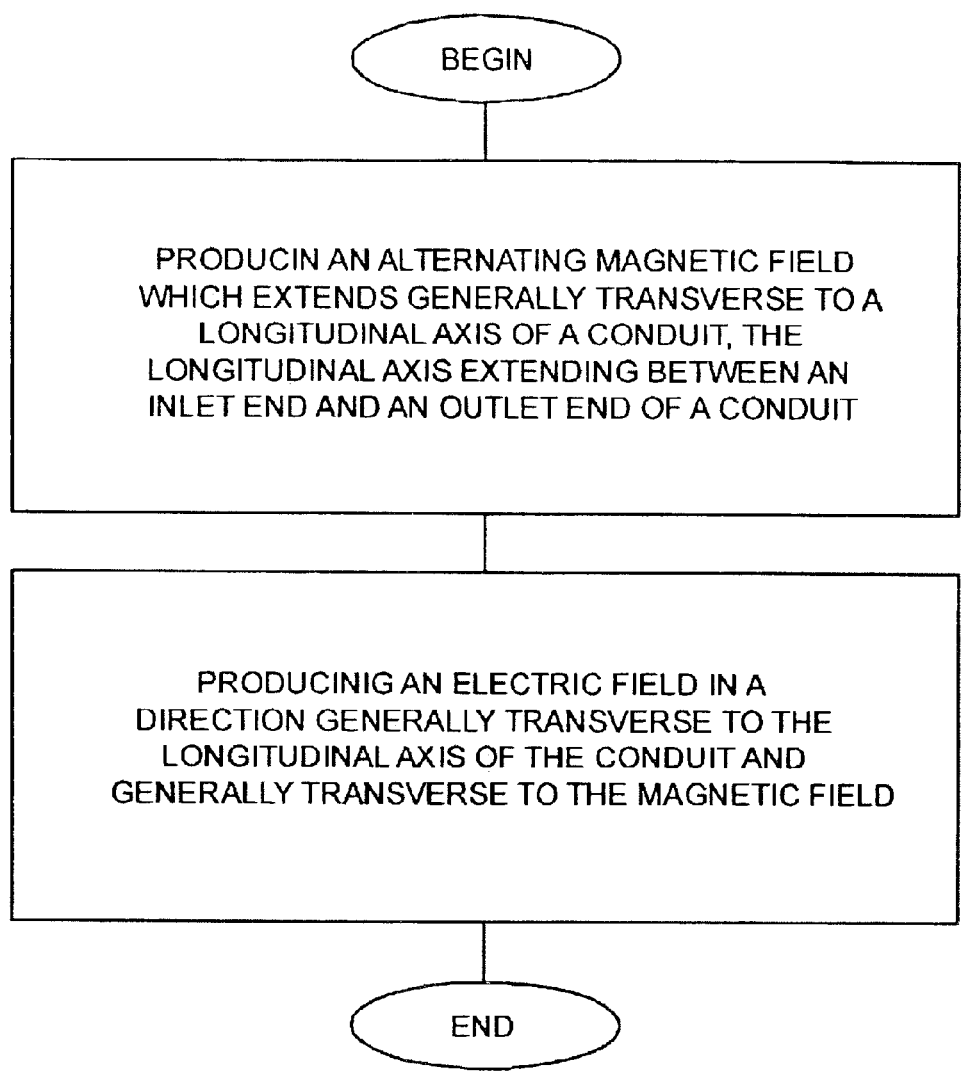
FIG. 9 is a flow chart showing a method of pumping particles from a first region containing a plasma to a second region containing a plasma at a higher pressure through a passageway embodying the principles of the present invention.

FIG. 9 shows a method of pumping particles from the first region 12 containing the process plasma 14 to the second region 16 through a passageway having an inlet end and an outlet end and being defined by an inner wall and an outer wall. The passageway can be any one of passageways 30, 130 or 230, for example. The method begins at 200. At 202, an alternating magnetic field is produced. The alternating magnetic field extends generally transverse to the passageway. At 204, an electric field is produced in a direction generally transverse to the passageway and generally transverse to the magnetic field. During operation, the mutually perpendicular fields, such as, magnetic field 126 and electric field 134, for example, generate a drift velocity of electrons in a perpendicular direction to both fields. The produced electric field accelerates electrons to the drift velocity, which is in the direction, either axial or radial depending on the passageway configuration, outward from the passageway. At 206, the method ends.

While the invention has been described with reference to certain illustrated embodiments, including particular structures, acts and materials, the invention is not to be limited to the particulars disclosed, but rather extends to all equivalent structures, acts, and materials, such are within the scope of the appended claims.

Figure 10:
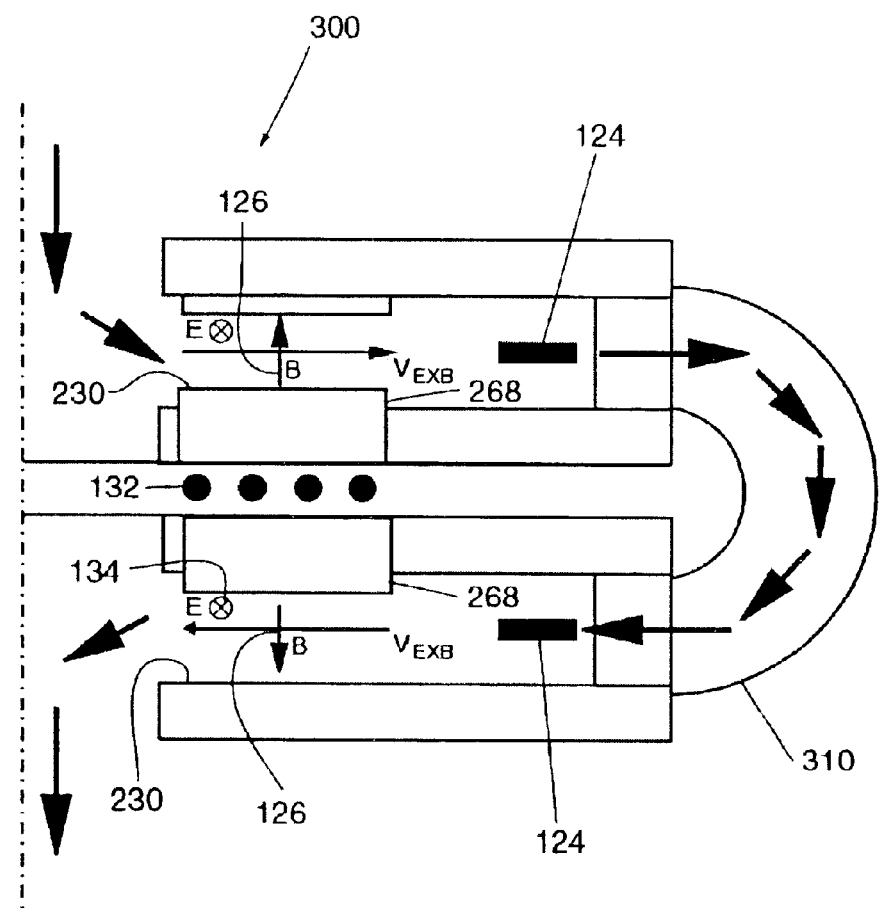
FIG. 10 is a schematic view showing yet another alternative plasma processing pump embodying the principles of the present invention, the other alternative plasma processing pump being configured to be employed in the plasma processing system of FIG. 1.

For example, though the passageway 30 is described above as being generally frusto-conical, other shapes can be used, for example, cylindrical or annular shapes. Additional pumping capacity can be obtained in the plasma pump 20 by enlarging the pumping system, by providing an array of pumps, and compression can be increased by stacking similar stages one after the other. For example, an embodiment 300 for high compression which can be obtained when one or more plasma 120 (shown in FIG. 8) radial pumps 120 adjacent each other, and connected to one another via a conduit 310. One proposed use could be to configure the radially topmost pump to draw gas in from the chamber (not shown) and, pushes the gas radially outwards (shown on the right side of FIG. 10). The gas flows outwards and is then ducted through the conduit 310, where the gas is turned 180 degrees to be directed radially inward, (shown on left side of FIG. 10). The gas is then directed through another stage (lowermost pump), which can share the same E-field excitation coil 132 with the first stage (uppermost pump). FIG. 10 shows a two-stage system, but another turn can be used with another stage (by positioning three plasma pumps 120 in a stacked arrangement, for example) in which gas would be directed radially outwards. By directing the gas radially in and outwards, a high compression can be achieved in a relatively compact structure that entirely surrounds the process chamber, extending downwards from the first (inlet) stage.

Since numerous modifications and changes to the embodiments described above will readily occur to those of ordinary skill in the art, it is not desired to limit the invention to the exact construction and operation illustrated and described. Accordingly, all suitable modifications and equivalents should be considered as falling within the spirit and scope of the invention.

What is claimed is:

1. A plasma pump to pump particles from a first region containing a plasma to a second region at a higher pressure, comprising:

a passageway having an inlet end and an outlet end, the passageway being defined by an inner wall and an outer wall;

a magnetic field producing member disposed within the passageway and constructed and arranged to produce an alternating magnetic field which extends generally transverse to the passageway and has a component in a radial direction;

an electric field producing member disposed outside of the passageway and constructed and arranged to produce a circumferential electric field, generally transverse to the passageway and generally transverse to the magnetic field.

2. A plasma pump according to claim 1, further comprising a power supply in electrical communication with at least one of the magnetic field producing member and the electric field producing member.

3. A plasma pump according to claim 2, further comprising a phase shifter configured and arranged to control a phase difference between power supplied to the magnetic field producing member and the electric field producing member.

4. A plasma pump according to claim 1, wherein the outer wall comprises a ferrite material.

5. A plasma pump according to claim 4, further comprising shielding disposed at least partially surrounding the ferrite material such that energy coupled from the electric field producing member into the ferrite material is reduced.

6. A plasma pump according to claim 4, further comprising a dielectric shield disposed at least partially surrounding the ferrite material.

7. A plasma pump according to claim 6, wherein the dielectric shield is a quartz shield.

8. A plasma pump according to claim 6, wherein coolant can be supplied between the dielectric shield and the ferrite material.

9. A plasma pump according to claim 1, wherein the outer wall includes an outer section having an increased radius and the magnetic field producing member is disposed in the outer section.

10. A plasma pump according to claim 1, wherein the inlet end of the passageway has a smaller radius than the outlet end of the passageway and the magnetic field producing member is disposed in the outlet end of the passageway.

11. A plasma pump according to claim 1, wherein the passageway is generally frusto-conical.

12. A plasma pump according to claim 1, wherein the passageway is generally cylindrical.

13. A plasma pump according to claim 1, wherein the passageway includes an upper portion whose cross-section in a plane orthogonal to the longitudinal axis is a first annulus, and a lower portion whose cross-section in a plane orthogonal to the longitudinal axis is a second annulus.

14. A plasma pump according to claim 13, wherein the first annulus has a radius smaller than a radius of the second annulus.

15. A plasma pump according to claim 1, wherein the passageway extends vertically.

16. A plasma pump according to claim 1, wherein the passageway extends horizontally.

17. A plasma pump to pump particles from a first region containing a plasma to a second region at a higher pressure, comprising:
- a first passageway having an inlet end and an outlet end, the first passageway being defined by an inner wall and an outer wall;
- a first magnetic field producing member disposed within the first passageway and constructed and arranged to produce an alternating magnetic field which extends generally transverse to the first passageway and has a component in a radial direction;
- a second passageway having an inlet end and an outlet end, the second passageway being disposed adjacent the first passageway and defined by an inner wall and an outer wall;
- a second magnetic field producing member disposed within the second passageway and constructed and arranged to produce an alternating magnetic field which extends generally transverse to the second passageway and has a component in a radial direction; and
- an electric field producing member disposed between the first and second passageways and constructed and arranged to produce a circumferential electric field, generally transverse to the first and second passageways and generally transverse to the first and second magnetic fields.

18. A plasma pump according to claim 17, further comprising:
- a third passageway having an inlet end and an outlet end, the third passageway being disposed adjacent the second passageway and defined by an inner wall and an outer wall;
- a third magnetic field producing member disposed within the third passageway and constructed and arranged to produce an alternating magnetic field which extends generally transverse to the third passageway and has a component in a radial direction; and
- a second electric field producing member disposed between the second and third passageways and constructed and arranged to produce a circumferential electric field, generally transverse to the second and third passageways and generally transverse to the second and third magnetic fields.

* * * * *